United States Patent
Naser et al.

(10) Patent No.: US 10,615,248 B1
(45) Date of Patent: Apr. 7, 2020

(54) ON-DIE CAPACITOR FOR A VLSI CHIP WITH BACKSIDE METAL PLATES

(71) Applicant: International Business Machines Corporation, Armonk, NY (US)

(72) Inventors: Hassan Naser, Austin, TX (US); Daniel Stasiak, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 16/142,792

(22) Filed: Sep. 26, 2018

(51) Int. Cl.
| H01L 23/48 | (2006.01) |
| H01L 49/02 | (2006.01) |
| H01L 21/768 | (2006.01) |
| H01L 23/522 | (2006.01) |

(52) U.S. Cl.
CPC ........ *H01L 28/40* (2013.01); *H01L 21/76816* (2013.01); *H01L 23/5223* (2013.01); *H01L 23/5226* (2013.01)

(58) Field of Classification Search
CPC ........... H01L 21/76816; H01L 23/5223; H01L 23/5226; H01L 23/5527; H01L 27/0688; H01L 28/40
USPC ....................................................... 257/774
See application file for complete search history.

(56) References Cited

U.S. PATENT DOCUMENTS

| 5,811,868 | A | 9/1998 | Bertin et al. |
| 6,222,246 | B1 | 4/2001 | Mak et al. |
| 6,236,103 | B1 | 5/2001 | Bernstein et al. |
| 6,342,724 | B1 | 1/2002 | Wark et al. |
| 6,492,244 | B1 | 12/2002 | Christensen et al. |
| 6,819,543 | B2 | 11/2004 | Vieweg et al. |
| 7,812,461 | B2 | 10/2010 | Pratt |
| 7,851,321 | B2 | 12/2010 | Clevenger et al. |
| 7,960,773 | B2 | 6/2011 | Chang et al. |
| 9,397,038 | B1 | 7/2016 | Uzoh et al. |
| 2009/0180257 | A1* | 7/2009 | Park ........................ H01L 23/64 361/709 |
| 2014/0183758 | A1* | 7/2014 | Nakamura .............. H01L 24/97 257/777 |

* cited by examiner

*Primary Examiner* — Brook Kebede
(74) *Attorney, Agent, or Firm* — Patterson + Sheridan, LLP

(57) ABSTRACT

Structure and method for a backside capacitor using through-substrate vias (TSVs) and backside metal plates. The structure includes: a substrate, a device layer over the substrate, a first plurality of metal layers connected to the device layer, where the device layer and the first plurality of metal layers are disposed on a first side of the substrate, and a second plurality of metal layers disposed on a second side of the substrate opposite the first side, where the second plurality of metal layers form at least one capacitor and where a plurality of through-substrate vias (TSVs) extend between the first plurality of metal layers and the second plurality of metal layers.

20 Claims, 6 Drawing Sheets

ON-DIE CAPACITOR FOR A VLSI CHIP WITH BACKSIDE METAL PLATES

BACKGROUND

The present invention relates to through vias, and more specifically, to forming one or more capacitors for a die using through-substrate vias.

Many methods have been suggested in semiconductor manufacturing technology to form 3D-ICs. 3D-IC technology typically demands very thin chips of tens of microns to achieve high density integration. The thin chips are stacked and electrically connected by through substrate vias (TSVs). Efficient use of TSVs permits superior electrical connection throughout a 3D-IC, and can offer other benefits for 3D-ICs. As such, there is a need to more effectively use TSVs for 3D-ICs.

SUMMARY

According to one embodiment of the present disclosure, a method is provided. The method includes: providing a substrate, providing at least one device layer over the substrate, providing a first plurality of metal layers over the at least one device layer on a first side of the substrate, where the first plurality of metal layers are connected to devices in the device layer, forming a second plurality of metal layers on a second side of the substrate opposite the first side, where the second plurality of metal layers form at least one capacitor, connecting the plurality of first metal layers to the second plurality of metal layers using a plurality of through-substrate-vias (TSVs).

According to another embodiment of the present disclosure, a structure is provided. The structure includes: The structure includes: a substrate, a device layer over the substrate, a first plurality of metal layers connected to the device layer, where the device layer and the first plurality of metal layers are disposed on a first side of the substrate, and a second plurality of metal layers disposed on a second side of the substrate opposite the first side, where the second plurality of metal layers form at least one capacitor and where a plurality of through-substrate vias (TSVs) extend between the first plurality of metal layers and the second plurality of metal layers.

DETAILED DESCRIPTION

Figure 1:
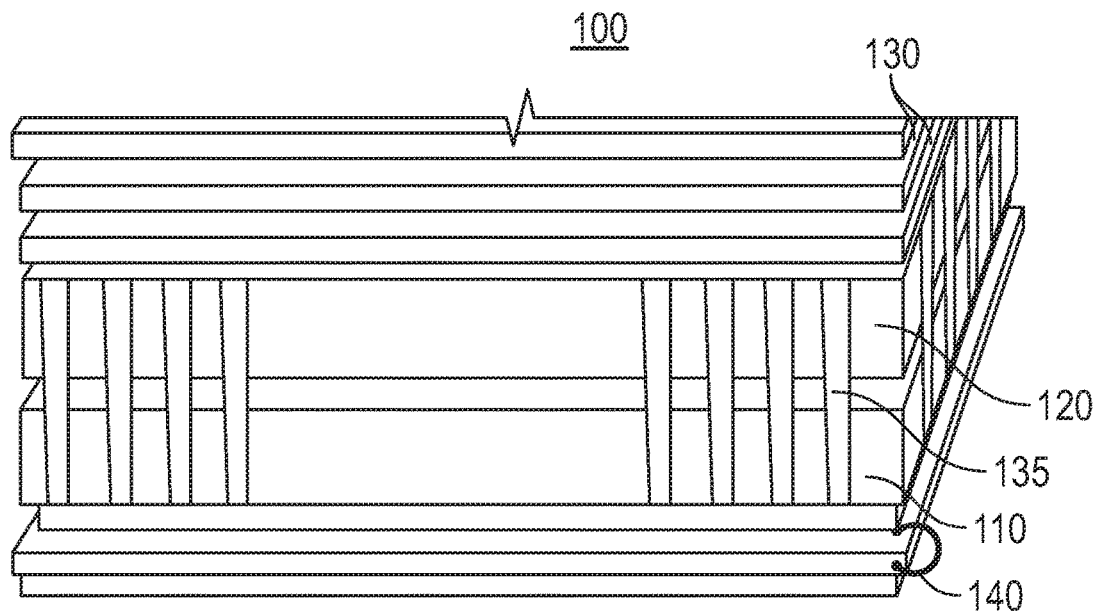
FIG. 1 illustrates a semiconductor structure with backside plates forming one or more capacitors in accordance with an embodiment of the present disclosure.

It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

Very-large-scale-integrated circuits ("VLSI circuits") can be fabricated on a thin silicon wafer or other suitable material. At least one benefit of the present disclosure is providing for one or more embodiments that utilize both sides of a silicon wafer (or other suitable material or wafer). One side forms a connection for the device layers, and the other side, e.g. the back side, has two or more metal plates for forming capacitors on the back side of the structure. The capacitors are connected to the entire structure by through-substrate vias (TSVs) and the contact of the TSVs through and on the two or more metal plates form the capacitors on the back side of the structure. Utilizing the backside of the structure is an efficient use of space for building large scale solutions, and having the capacitors on the back of the substrate allows for direct connection to components, such as transistors, located on a device layer(s) of the structure, which in turn provides for more efficient device use by minimizing current leakage.

FIG. 1 illustrates a semiconductor structure 100 with one or more on-die capacitors (discussed below) formed on the back (as shown in FIG. 3) of a substrate 110 (or other supportive material) by multiple through-substrates via (TSV) connections 135. The substrate 110 can be any suitable material or wafer, including but not limited to a silicon (Si) wafer or a Si substrate 110. The structure 100 can include one or more device layers 120 over the substrate 110 (also referred to as active regions), where the one or more device layers 120 can include one or more transistors, conductors, insulating materials and layers, or any other suitable semiconductor devices thereon, collectively device layer components 122 as shown in FIG. 3. The device layers 120 can be formed using any suitable semiconductor process or processes, including one or more steps that employ CVD and PVD techniques. The structure can also include one or more metal layers 130 over the device layer 120, where the metal layers 130 can be any suitable conductive materials, e.g. tungsten or copper, and can be deposited using any suitable deposition or plating techniques.

The device 100 is interconnected using multiple TSV connections 135. In one embodiment, a set 140 of two or more metal plates is deposited on the back of the device 100, e.g. the back or unused side 110a of substrate 110 using any suitable plating or deposition process. The plates forming the set 140 are discussed in greater detail with reference to FIG. 2A, FIG. 2B, FIG. 4A, and FIG. 4B. One plate has holes formed there-through to enable the TSVs 135 to connect through one plate and into another plate. The interconnection forms the one or more capacitors (discussed below). Any suitable back end of the line (BEOL) technique can be employed to form the TSVs 135 and interconnection throughout the device 100.

Figure 2A:
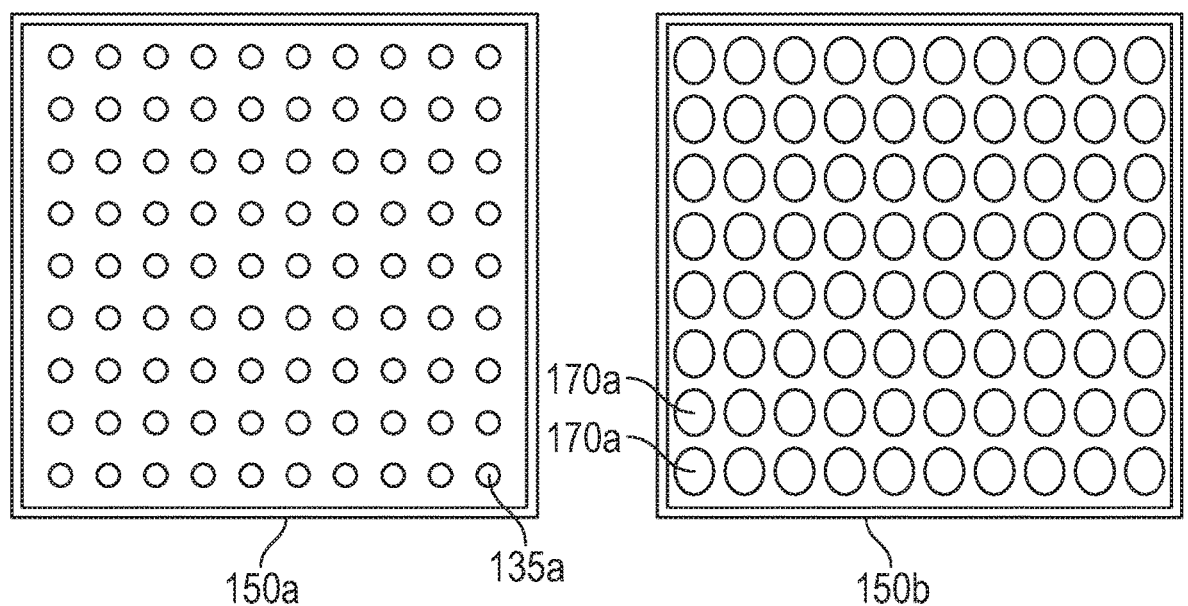
FIG. 2A illustrates backside plates for a semiconductor structure in accordance with an embodiment of the present disclosure.
Figure 2B:
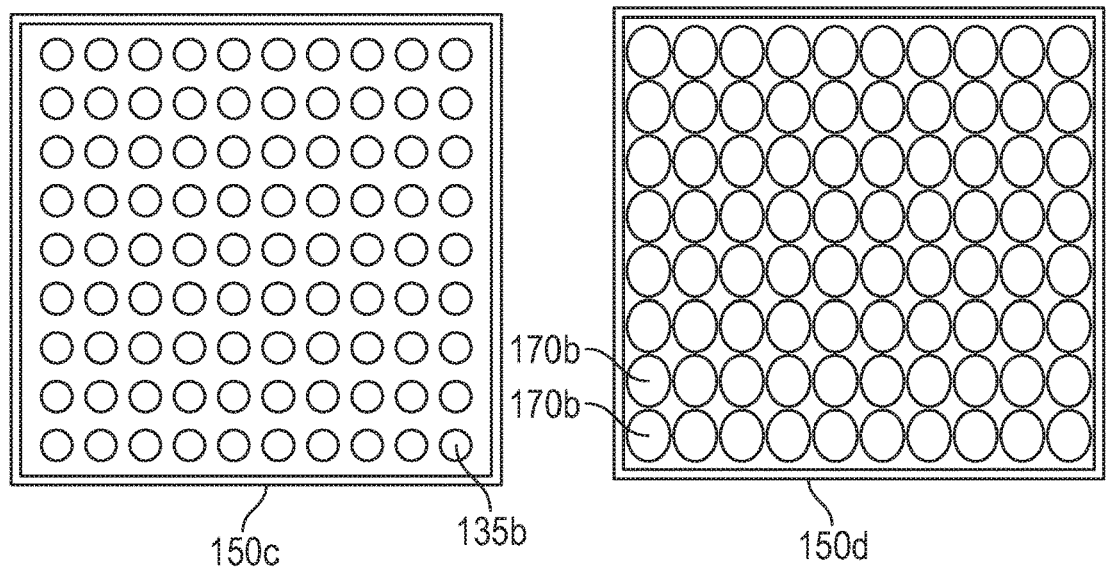
FIG. 2B illustrates backside plates for a semiconductor structure in accordance with an embodiment of the present disclosure.

FIG. 2A illustrates a configuration for back plates 150a and 150b where the TSVs are micro-TSVs 135a. The length of the TSVs 135 are generally a little longer than the wafer thickness and the width or diameter of the TSVs 135 may depend on what the fabrication technique being used (e.g., 65 nm, 22 nm, 7 nm, etc.). FIG. 2B illustrates a configuration for back plates (e.g. any suitable conductive plates, including but not limited to copper, tungsten, gold, silver, etc.) 150c and 150d, where the TSVs 135 are standard TSVs 135, e.g. 20 nm to 25 nm in length.

In FIG. 2A, holes 170a are formed on plate 150a using any suitable etching or laser technique, where the holes 170a can accommodate micro-TSVs. In FIG. 2B, holes 170b are formed on plate 150b using any suitable etching or laser technique, where the holes 170b can accommodate standard TSVs.

In one embodiment, whether the configuration of FIG. 2A or FIG. 2B is employed, the template for holes 170a and/or 170b is based on the nature of the BEOL connection or wiring scheme used to interconnect the substrate 110, the device layers 120, and the metal layers 130. The holes 170a and 170b can be formed on the applicable plates in light of the wiring scheme using any suitable laser or etching technique.

Figure 3A:
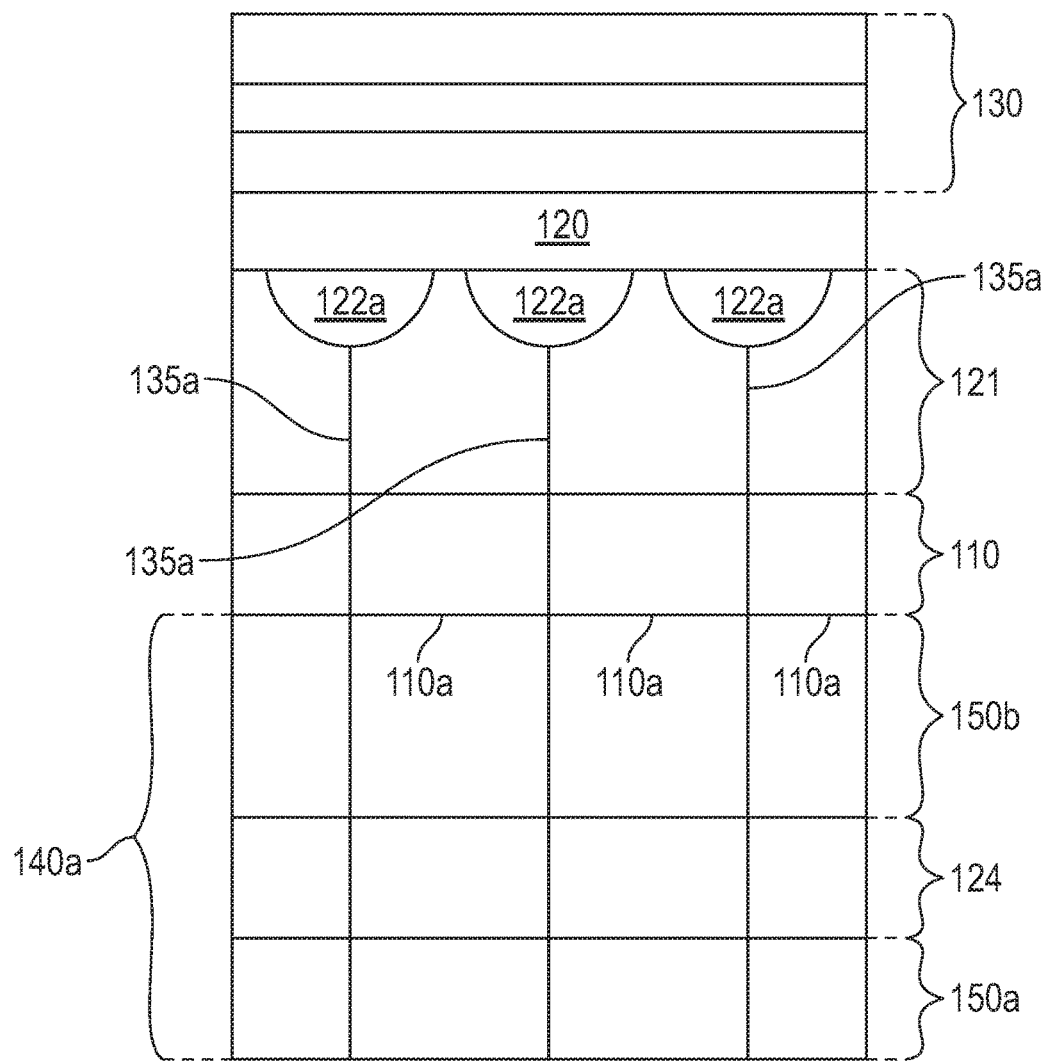
FIG. 3A illustrates a semiconductor structure with backside plates forming one or more capacitors in accordance with an embodiment of the present disclosure.

FIG. 3A shows a cross-section of structure 100 when backsides 150a, 150b are used to form the one or more capacitors 140a. In one embodiment, one or more dielectric layers 121 are formed over the substrate 110 and in contact with one or both of the substrate 110 and the device layers 120. In one embodiment, as stated, prior to depositing the back plates 150a, 150b, TSVs, e.g. micro TSVs 135a, can connect directly to transistors 122 (or any other suitable device layer 120 component) using any suitable BEOL connection and wiring technique. The direct connection to the transistors 122 enhances the overall power transfer and storage of the device 100 by providing a shorter distance of power transfer between the transistors 122 and the to-be-formed capacitors 140a, in addition to providing a direct connection thereto.

In one embodiment, a dielectric layer 124 is deposited on semiconductor plate 150a, followed by patterning the holes 170a (shown in detail in FIG. 2A) through semiconductor substrate 110 after the TSVs 135a interconnect the structure. Any suitable etching or laser technique can be used to make the holes 170a. The holes 170a may have inner sidewalls and inner bottom surface covered with a conformal dielectric liner (not shown), such as $SiO_2$ or $Si_3N_4$. The holes 170a are filled with micro-TSV structures 135a that can be composed of any suitable conductive material, such as copper or tungsten, and which interconnect the device 100. (In one embodiment, air can be used as a dielectric material and one or both of dielectric material and inner liners can be omitted). In one embodiment, as shown, the plurality of TSVs 135a are micro-TSVs, and the back plates 150a, 150b of FIG. 2A are used. In another embodiment, although not shown, back plates 150c, 150d of FIG. 2B are employed, and the TSVs 135a are standard TSVs.

Figure 3B:
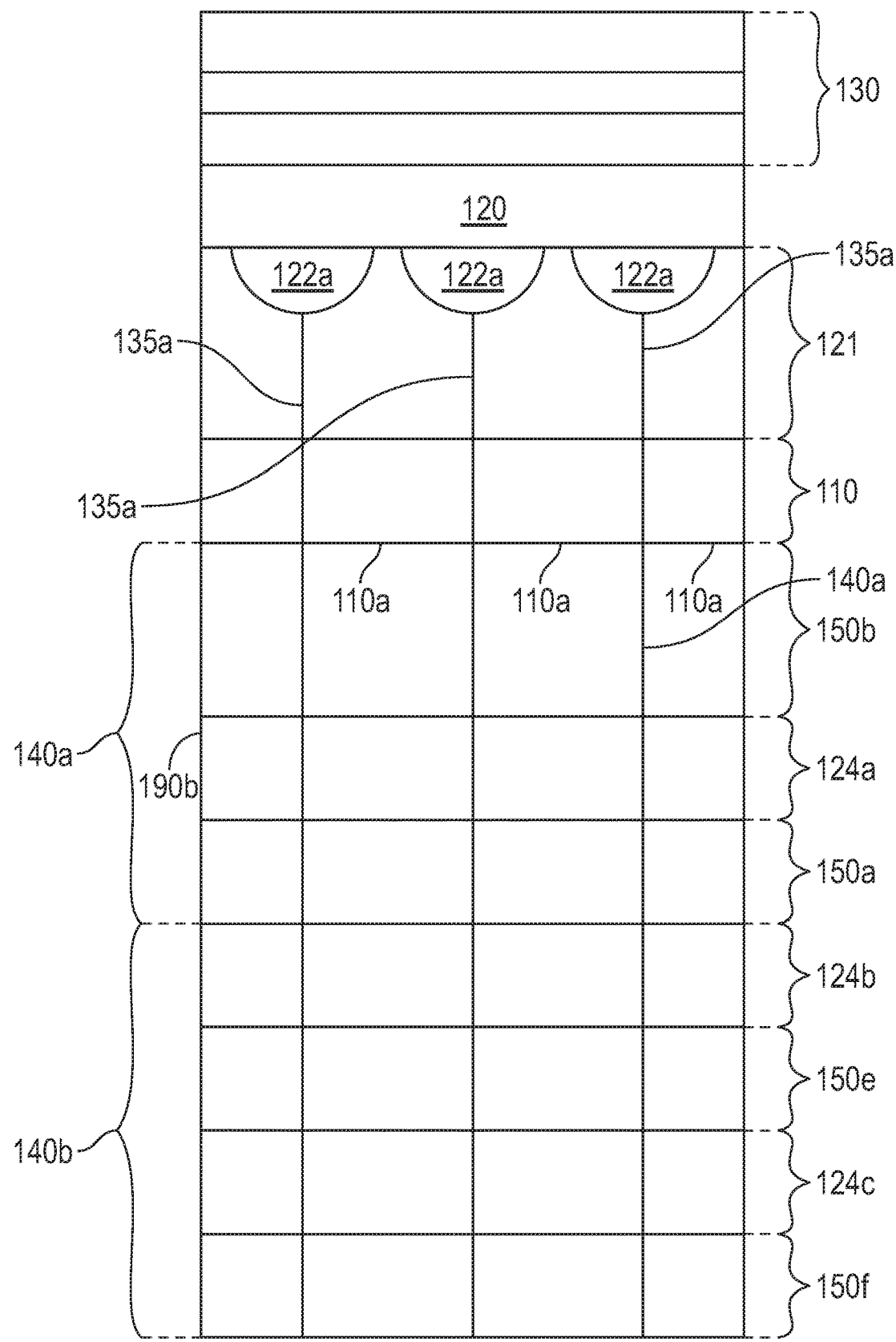
FIG. 3B illustrates a semiconductor structure with backside plates forming one or more capacitors in accordance with an embodiment of the present disclosure.

FIG. 3B illustrates the configuration of FIG. 3A with additional plates 150e and 150f at the back end of the structure to form a stacked structure with multiple layers of capacitance at the back—i.e., capacitor 140a and 140b. According to the configuration of FIG. 3B, which as shown uses the scheme of FIG. 2A in one embodiment, multiple plates, including but not limited to 150a, 150b, 150e, and 150f (with dielectric layer 124c between 150e and 150f and dielectric layer 124b separating the two capacitors 140a and 140b) can be formed in the z direction (the same can be done with the configuration of FIG. 2B). In the scheme that employs the back plate configuration of FIG. 2A, the holes 170a can be formed in any direction including laterally across, up or down, through the center, and on the periphery of 150b (and 150f if multiple sets are used). Since the holes 170a can be formed in any direction, the one or more capacitors 140 formed on the backside of the structure 100 can be in any direction, including the x and y direction, as well as in the z-direction. In one embodiment, the partitioning to form the one or more capacitors 140 is more clearly shown in FIG. 4A (and with reference to the surface of plate 150b) discussed below. In one embodiment, metal plates 150a and 150b (and by extension metal plates 150e and 150f) can be substantially the same thickness and/or have substantially the same resistivity.

Figure 4A:
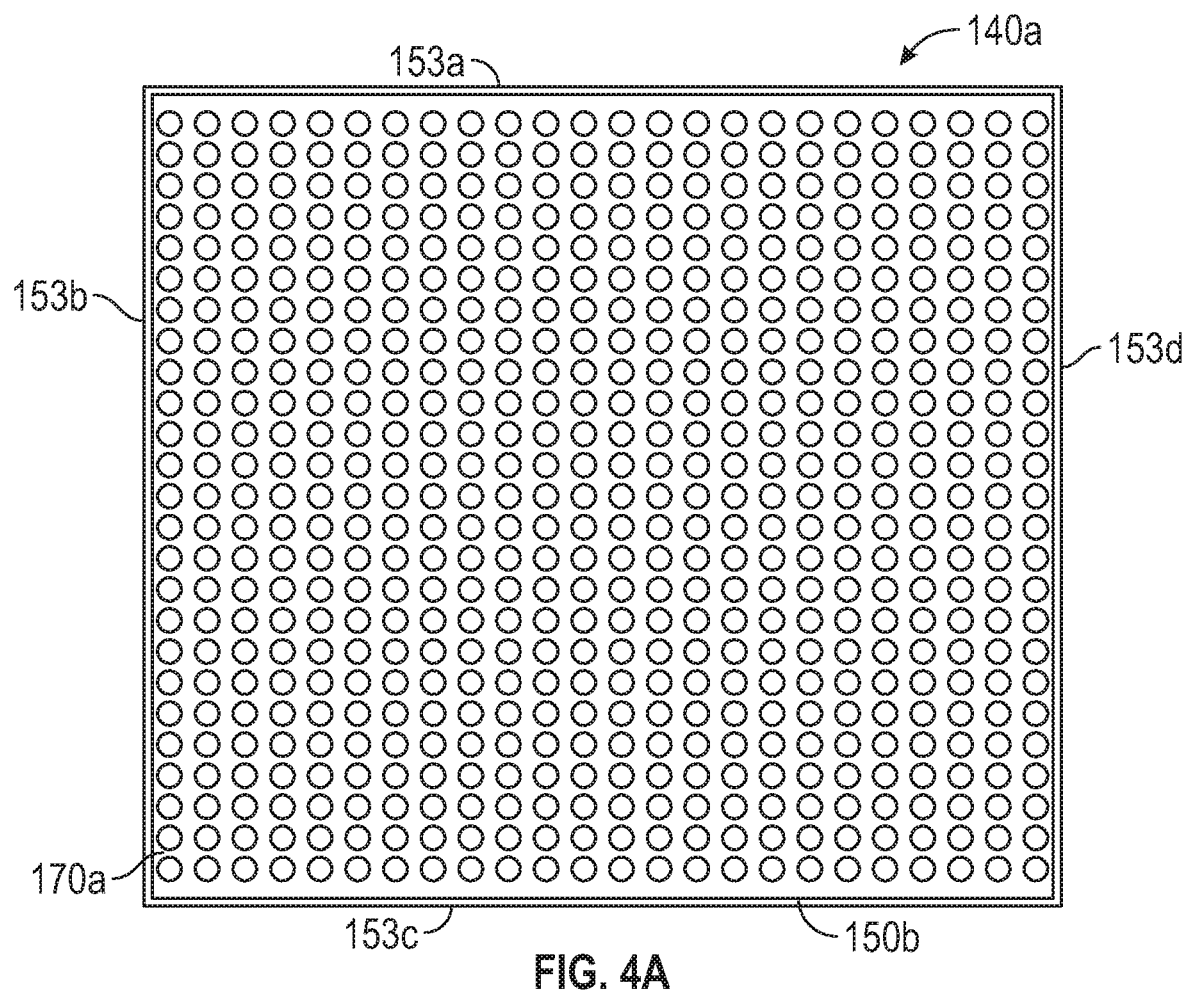
FIG. 4A illustrates a top backside plate configuration for forming one or more capacitors in accordance with an embodiment of the present disclosure.

As shown in FIG. 3B, in one embodiment, since the holes 170a can be formed in any direction, the multilayers, e.g. the additional plates 150e, 150f, can each also have capacitors in the x and y direction, in addition to the z direction, where each metal plate with holes has the same distribution of holes 170a (see FIG. 4A). In one embodiment (see FIG. 4A and FIG. 4B), the connection between plates 150a and 150b can be formed such that a single capacitor is formed and in one embodiment more than one capacitor is formed. In one embodiment, plates 150a, 150e are VSS plates and plates 150b, 150f are VDD plates. Similarly, in the case where standards TSVS are used, 150c can be a VSS plate and 150d can be a VDD plate.

With respect to FIGS. 4A, 4B, 4C, and 4D, one or more capacitors 140a can be formed by adjusting the dielectric material (not shown) (during initial deposition) between the plates 150a, 150b or 150c, 150d, by adjusting the interconnection of the vias through the holes 170a or 170b, e.g. the larger the area between via connections, the larger the capacitor, and/or by partitioning the plate (See FIG. 4C in reference to plate 150d, but applicable to plate 150b as well) using any suitable lasering, soldering, or other suitable partitioning technique. It is to be appreciated that the one or more schemes are shown with reference to the surface of back plate 150b (FIG. 4A and FIG. 4B) and back plate 150d (FIG. 4C and FIG. 4D), with the complete wiring being accomplished as discussed with reference to the above discussion(s) or any other suitable technique.

FIG. 4A illustrates the metal plate 150b in more detail to illustrate partitioning and forming a capacitor 140a (as stated above, FIG. 4A is with reference to a single back plate, and it is understood that the completed structure is ascertained with reference to FIG. 3). In one embodiment, a micro-TSV scheme is used, and via connections to the back plate 150a (not shown) can be in any direction, e.g. through the center and the periphery of 150b. The back plate 150b as show in FIG. 4A illustrates one or more embodiments for one or more capacitors 140a of FIG. 3. In one embodiment, the vias connect to the periphery only, e.g. sections 153a, 153b, 153c, and 153d, thus creating a single large capacitor 140a.

Figure 4B:
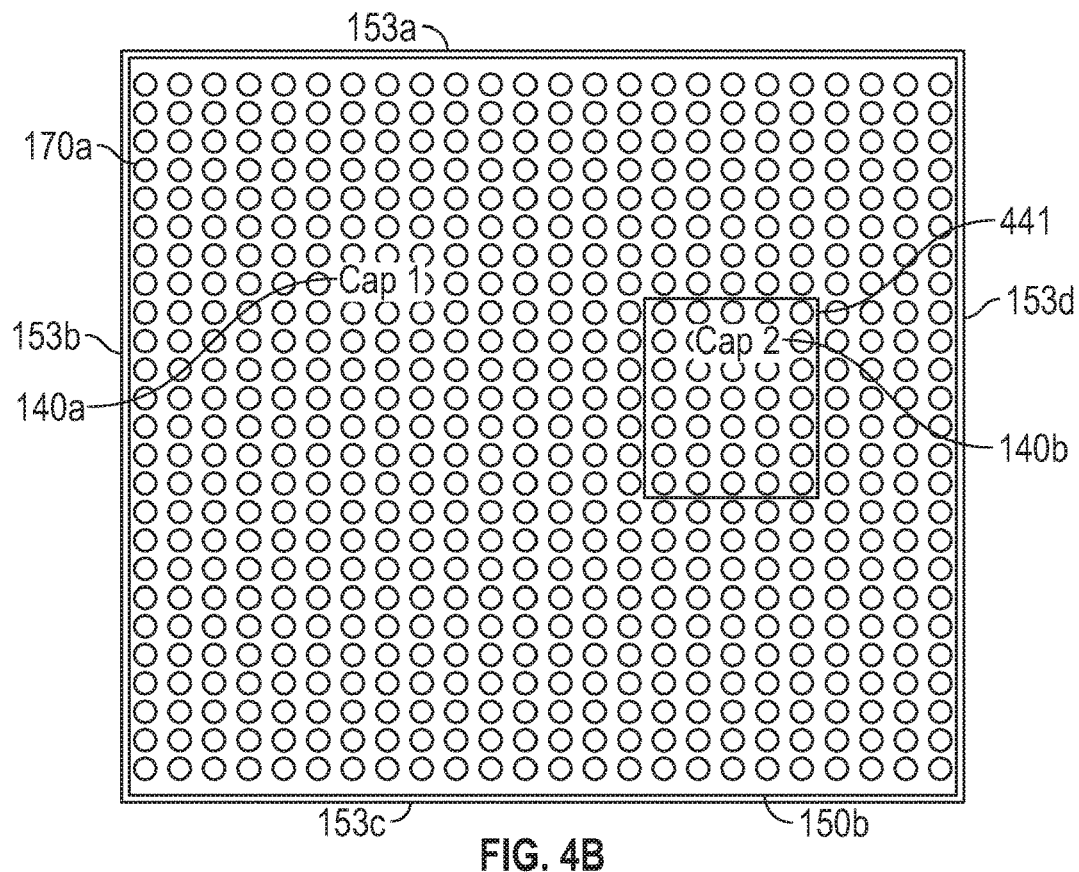
FIG. 4B illustrates a top backside plate configuration for forming one or more capacitors in accordance with an embodiment of the present disclosure.

FIG. 4B illustrates the metal plate 150b in more detail to illustrate partitioning and forming one or more capacitors 140a (as stated above, FIG. 4B is with reference to a single back plate, and it is understood that the completed structure is ascertained with reference to FIG. 3). In one embodiment, a micro-TSV scheme is used, and via connections to the back plate 150a (not shown) can be in any direction, e.g. through the center and the periphery of 150b. A single capacitor 140a can be formed as in FIG. 4A, but an additional capacitor 140b is formed by connecting vias through holes 170a to the plate 150a (not shown) in the bounded area 441 while the remaining portion of the plate is part of a different capacitor 140a.

Figure 4C:
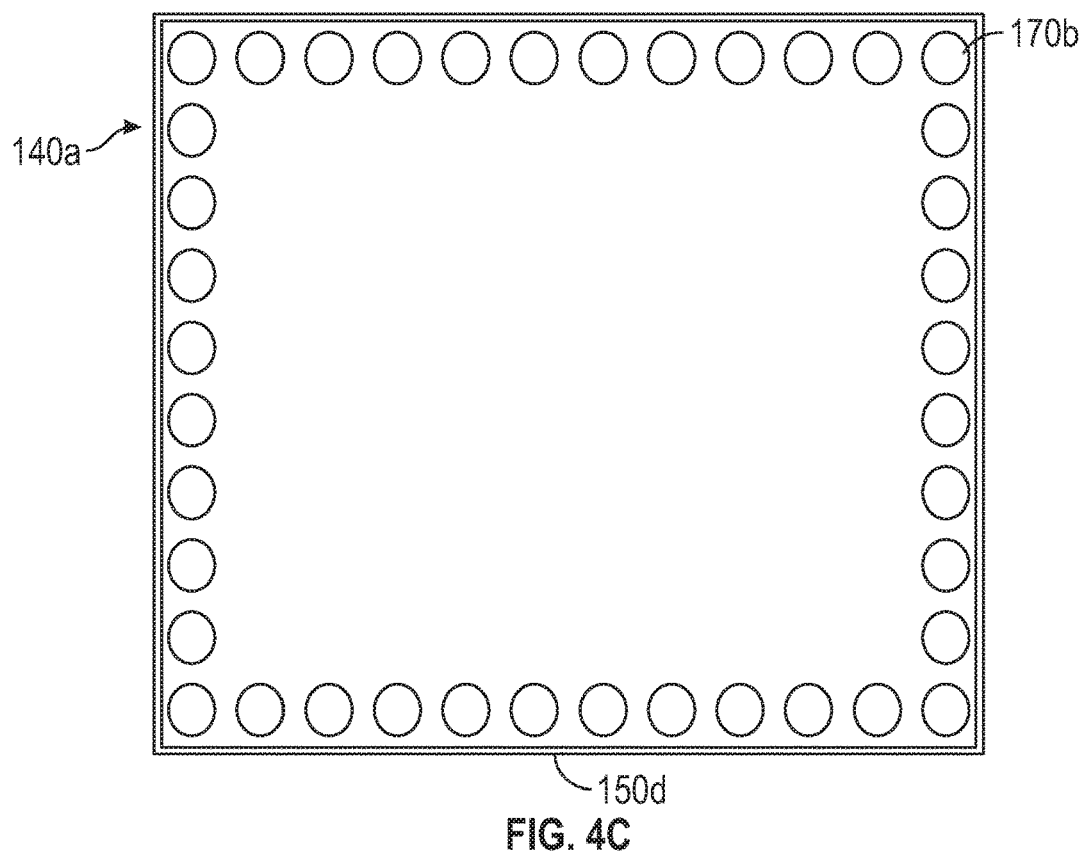
FIG. 4C illustrates a top backside plate configuration for forming one or more capacitors in accordance with an embodiment of the present disclosure.

FIG. 4C illustrates the metal plate 150d (as stated above, FIG. 4C is with reference to a single back plate, and it is understood that the completed structure is ascertained with reference to FIG. 3) in more detail to illustrate partitioning and forming the capacitor 140a. In one embodiment, a standard-TSV scheme is used, via connections to the back plate 150c (not shown) can go along and through the periphery of 150d, which is not partitioned and which has a substantially uniform dielectric material (not shown) between 150d and 150c.

Figure 4D:
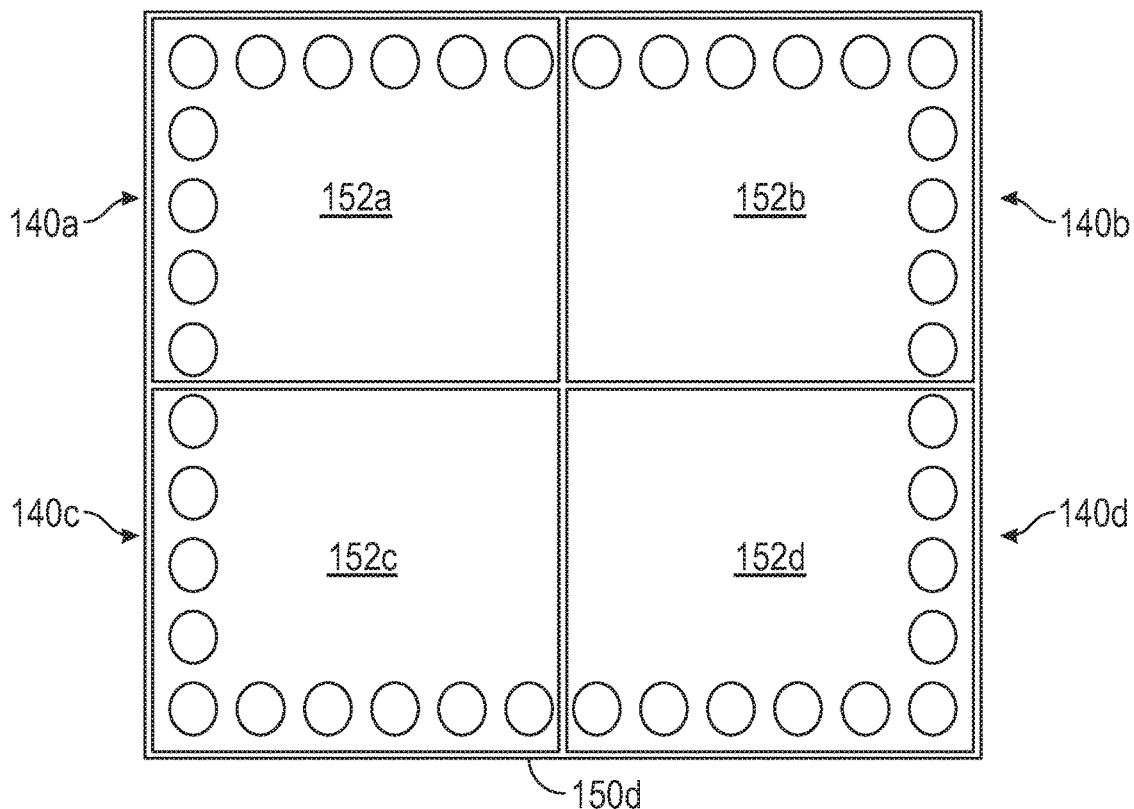
FIG. 4D illustrates a top backside plate configuration for forming one or more capacitors in accordance with an embodiment of the present disclosure.

FIG. 4D (as stated above, FIG. 4D is with reference to a single back plate, and it is understood that the completed structure is ascertained with reference to FIG. 3) illustrates the metal plate 150d in more detail to illustrate one or more embodiments of the present disclosure related to partitioning and forming more than one capacitor 140a. In one embodiment, where a standard-TSV scheme is used, via connections to the back plate 150c (not shown) can go along and through the periphery of 150d, where 150d is partitioned into sections 152a, 152b, 152c, and 152d, and where a substantially uniform dielectric material (not shown) is between 150d and 150c. Each partitioned region 152a, 152b, 152c, and 152d corresponds to a section of back plate 150d and back plate 150c (not shown) and constitutes a single capacitor, for a total of four capacitors as shown in FIG. 4D???, although other schemes are possible in accordance with the techniques described herein.

Figure 5:
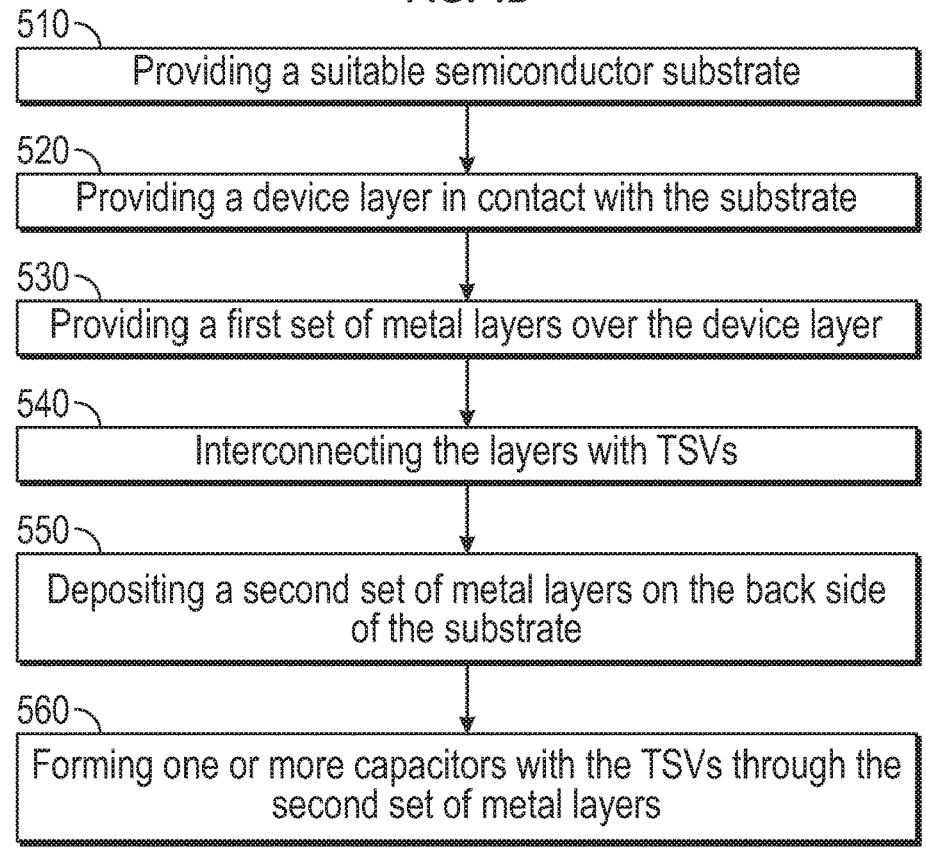
FIG. 5 illustrates a flow for forming a semiconductor structure in accordance with at least one embodiment of the present disclosure.

FIG. 5 illustrates a flow 500 for forming one or more back plate capacitors 140a in accordance with at least one embodiment of the present disclosure. Each one of the blocks of the flow can be executed by one or more suitable semiconductor tools and using one or more suitable semiconductor steps. Block 510 provides any suitable semiconductor substrate 110 or supporting material, e.g. silicon. Block 520 provides a device layer 120 that contains one or more semiconductor structures, including transistors, over the substrate, where the device layer 120 can be formed using any combination of suitable semiconductor deposition or formation techniques. Block 530 provides a first set of metal layers 130 over the device layer 120 using any suitable deposition or plating technique. Block 540 interconnects the layers 130, 120, and 110 using one or more TSV connections 135 and using any suitable BEOL technique. In one embodiment, the TSV connections are composed of micro TSVs 135a and in one embodiment the TSV connections are composed of standards TSVs. In block 550, a second set of metal layers, e.g. back plates 150a, 150b, are deposited on the opposite end of the substrate 110, where at least one of the back plates 150a, 150b has holes, e.g. 170a, for connecting to the other back plate using the TSV connections. In one embodiment, the TSV connection 135 used to connect layers 110, 120, and 130 will serve as the template for the holes 170a. In one embodiment, both the first set of metal layers 130 and the second set of metal layers, e.g. 150a, 150b, are made of any suitable conducting material, including tungsten, copper, gold, and silver.

In one embodiment, per block 560, a suitable dielectric material is deposited in between the back metal plates 150a, 150b, and in conjunction with the TSV connections, forms one or more capacitors 140a. Per block 570, the number and size of the capacitors is adjustable by the manner in which the TSVs 135 are connected, where in one embodiment micro TSVs 135a can go through holes that cover periphery and center of a back plate and where in one embodiment TSVs 135 are standard TSVs that can connect along the periphery of a back plate. In one embodiment, the TSVs 135a connect directly to devices in the device layer 120. In one embodiment, the one back plate is a VSS plate and one plate is a VDD plate, and both plates have substantially the same thickness. In one embodiment, more than one set of back plates 150a, 150b are deposited on the backside of the substrate 110 in order to form multiple layers of capacitors. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

While the foregoing is directed to embodiments of the present invention, other and further embodiments of the invention may be devised without departing from the basic scope thereof, and the scope thereof is determined by the claims that follow.

What is claimed is:

1. A method comprising:
   providing a substrate;
   providing at least one device layer over the substrate;
   providing a first plurality of metal layers over the at least one device layer on a first side of the substrate, wherein the first plurality of metal layers are connected to devices in the device layer;
   forming a second plurality of metal layers on a second side of the substrate opposite the first side, wherein the second plurality of metal layers form at least one capacitor; and
   connecting the plurality of first metal layers to the second plurality of metal layers using a plurality of through-substrate-vias (TSVs).

2. The method of claim 1, wherein forming the second plurality of metal layers comprises:
   forming a plurality of holes through a first one of the second plurality of metal layers; and
   connecting the plurality of TSVs to a second one of the second plurality of metal layers using the plurality of holes through the first one of the second plurality of layers.

3. The method of claim 2, wherein the connection of the plurality of TSVs to the second one of the second plurality of metal layers forms the at least one capacitor on the second side of the substrate.

4. The method of claim 3, wherein the first one of the second plurality of metal layers is a VSS plate and the second one of the second plurality of layers is a VDD plate.

5. The method of claim 4, wherein forming the plurality of holes through the first one of the second plurality of metal layers comprises:
   forming the plurality of holes at a center and at a periphery of the first one of the second plurality of layers.

6. The method of claim 5, wherein the plurality of TSVs are micro-TSVs.

7. The method of claim 6, wherein the micro-TSVs connect to one or more transistors on the device layer.

8. The method of claim 7, wherein the second plurality of metal layers comprises more than two layers.

9. The method of claim 4, wherein forming the plurality of holes through the first one of the second plurality of metal layers comprises:
   forming the plurality of holes only through a periphery of the first one of the plurality of metal layers.

10. The method of claim 9, wherein the plurality of TSVs are standard TSVs.

11. A structure comprising:
    a substrate;
    a device layer over the substrate;
    a first plurality of metal layers connected to the device layer, wherein the device layer and the first plurality of metal layers are disposed on a first side of the substrate; and
    a second plurality of metal layers disposed on a second side of the substrate opposite the first side, wherein the second plurality of metal layers form at least one capacitor and wherein a plurality of through-substrate vias (TSVs) extend between the first plurality of metal layers and the second plurality of metal layers.

12. The structure of claim 11, wherein the connection of the plurality of TSVs through the second plurality of metal layers form the at least one capacitor.

13. The structure of claim 12, wherein the plurality of TSVs are micro-TSVs.

14. The structure of claim 13, wherein a first one of the second plurality of layers is a VSS plate and wherein a second one of the second plurality of layers is a VDD plate.

15. The structure of claim 14, wherein the plurality of TSVs enter the VDD plate through a plurality of holes in the VSS plate.

16. The structure of claim 15, wherein the plurality of TSVs contact both a periphery portion and a center portion of the VDD plate.

17. The structure of claim 16, wherein the plurality of TSVs connect to one or more transistors on the device layer.

18. The structure of claim 15, wherein the second plurality of layers includes more than two layers.

19. The structure of claim 14, wherein the plurality of TSVs contact a periphery portion of the VDD plate without contacting a center portion of the VDD plate.

20. The structure of claim 19, wherein the plurality of TSVs are standard TSVs.

* * * * *